United States Patent [19]

Abbe et al.

[11] 4,228,392
[45] Oct. 14, 1980

[54] SECOND ORDER CORRECTION IN LINEARIZED PROXIMITY PROBE

[75] Inventors: Robert C. Abbe, Newton; Noel S. Poduje, Needham Heights; Daniel Klein, Boston, all of Mass.

[73] Assignee: Ade Corporation, Watertown, Mass.

[21] Appl. No.: 840,852

[22] Filed: Oct. 11, 1977

[51] Int. Cl.² .......................................... G01R 27/26
[52] U.S. Cl. ................................ 324/61 R; 324/132; 328/162; 330/109
[58] Field of Search ............. 324/61 R, 57 N, 123 R, 324/123 C, 130, 132; 328/162; 330/98, 109; 73/753

[56] References Cited

U.S. PATENT DOCUMENTS

| | | | |
|---|---|---|---|
| 2,438,217 | 3/1948 | Johnson | 330/109 X |
| 3,267,377 | 8/1966 | Mandoli et al. | 324/132 X |
| 3,370,248 | 2/1968 | Treu et al. | 330/109 X |
| 3,502,983 | 3/1970 | Ingle et al. | 328/162 X |
| 3,548,323 | 12/1970 | Gordon et al. | 328/162 X |
| 3,837,227 | 9/1974 | Tavis | 73/753 |
| 3,904,961 | 9/1975 | Vieri | 324/132 X |
| 4,000,463 | 12/1976 | Katzmann et al. | 324/132 |
| 4,002,977 | 1/1977 | Sun et al. | 324/132 |
| 4,069,459 | 1/1978 | Lee | 330/109 X |

*Primary Examiner*—M. Tokar
*Attorney, Agent, or Firm*—Weingarten, Maxham & Schurgin

[57] ABSTRACT

A system for reducing higher order nonlinearities in the linearized output of a dimension gauging probe in which the dimension gauging probe provides an output varying inversely with the physical dimension gauged which is in turn linearized to a signal varying proportionally with the physical dimension. Higher order nonlinearities, an error condition, which deviate the correspondence between the gauged dimension and the output from a linear or straight-line function, are reduced by feedback of the linearized output to the probe and, preferably, by feedforward of a portion of the probe output signal to the linearized signal.

18 Claims, 3 Drawing Figures

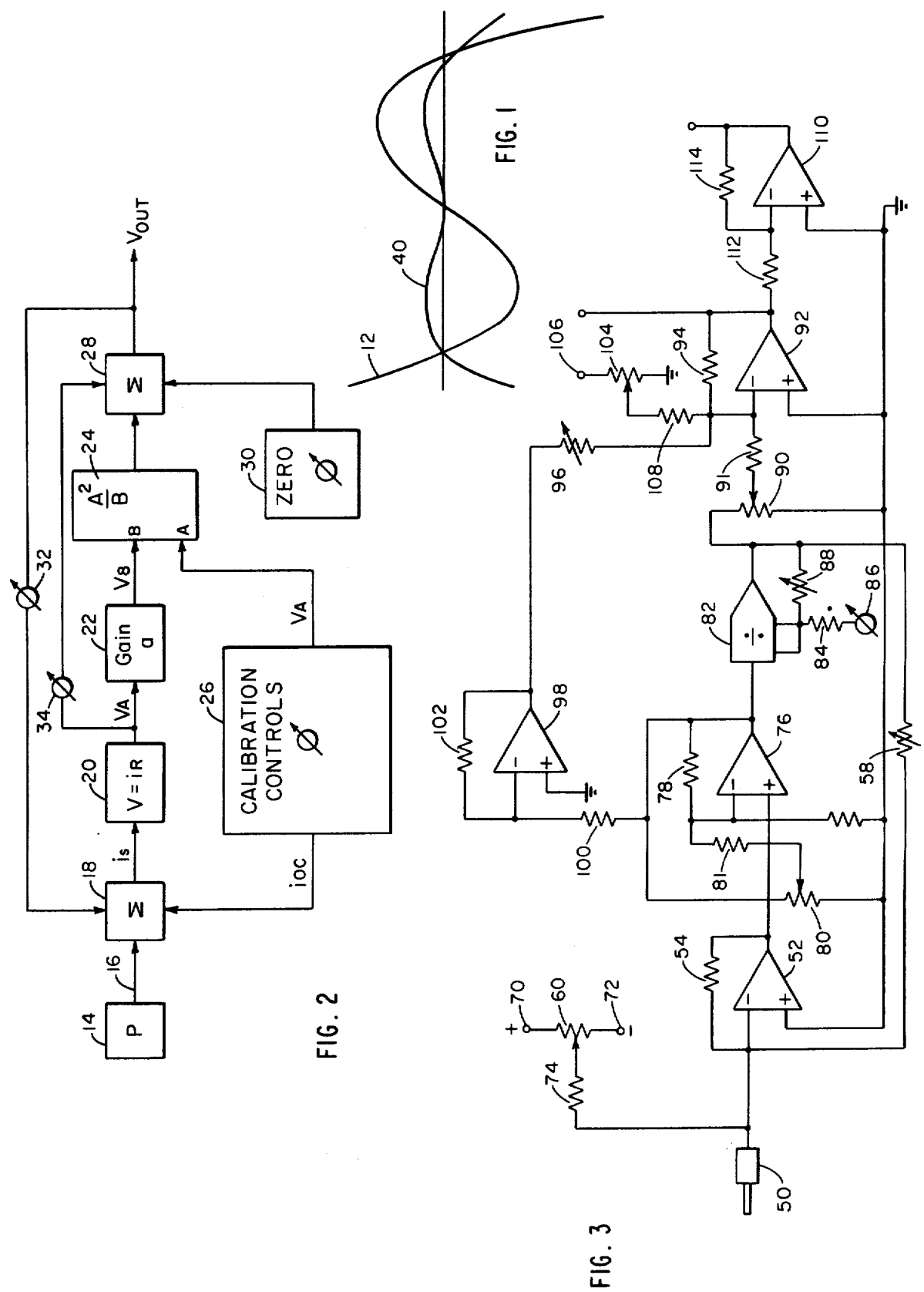

SECOND ORDER CORRECTION IN LINEARIZED PROXIMITY PROBE

FIELD OF THE INVENTION

The present invention relates to signal linearization systems and in particular to systems which eliminate higher order nonlinearities in a system in which first order nonlinearities are eliminated.

BACKGROUND OF THE INVENTION

In capacitive dimension gauging, as, for example, represented by commonly assigned U.S. Pat. Nos. 3,706,919, 3,775,679 and 3,990,005, it is known that the typical capacitive output varies inversely with the physical dimension gauged. This is due to the mathematics of capacitive gauging. It is often desired to convert this inversely varying output signal into a signal which is directly proportional to the dimension being gauged and accordingly linearizing schemes as evidenced in the above, last identified patents have been developed. Such schemes typically operate by electronic analog or digital division circuitry and/or nonlinear circuits themselves such as breakpoint approximation networks.

The resulting signal directly proportional to the gauged dimension is, however, not entirely free of nonlinearities. While indeed this signal does vary with the dimension being gauged, the transfer function between the output signal and dimension is seldom a perfectly straight line as would be desired. The actual deviation from the straight line condition can be as much as several percent of the value being measured.

BRIEF SUMMARY OF THE INVENTION

In accordance with the teaching of the present invention, a linearization system is provided for removing higher order nonlinearities from a linearized probe output signal. In this context, higher order nonlinearities are intended to include those which primarily cause the linearized probe output to deviate from a pure, straight line correspondence with the gauged dimension.

In specifically implementing this concept, the preferred embodiment of the present invention includes a ratio circuit which provides an output representative of the ratio between numerator and denominator inputs with the numerator input provided by a reference signal, and the denominator input provided in response to the probe output signal. The resulting output converts the probe output signal inversely varying with dimension to a signal directly varying with gauged dimension. This latter signal is fed back and algebraically combined with the probe output signal before application to the ratio circuit and, preferably, the combined signal is fed forward and algebraically combined with the output of the ratio circuit before re-introduction in combination with the probe output.

Controls are provided for varying the reference signal and other circuit parameters to optimize the reduction of nonlinearities.

BRIEF DESCRIPTION OF THE DRAWING

These and other features of the present invention are more fully set forth below in the exemplary and nonlimiting detailed description of the preferred embodiment and the accompanying drawing of which:

FIG. 1 is a graphical representation of output nonlinearities useful in understanding the invention;

FIG. 2 is a block diagrammatic representation of the higher order linearization circuit of the present invention; and FIG. 3 is a schematic diagram showing more detailed implementation of the nonlinearity reduction system of the present invention.

DETAILED DESCRIPTION OF THE INVENTION

The present invention contemplates a system for reducing higher order nonlinearities in the linearized output of a dimension gauging probe in which the probe inherently provides an output having first order nonlinearities such as a variation inversely proportional to the physical dimension gauged. In particular, where a probe, such as a capacitive distance gauging probe as described in the above-referenced United States patents is employed for gauging a dimension, it is typical to provide a linearizing circuit operative on the probe output to convert the dimension representing signal from inverse variation with dimension to direct variation with dimension. In the ideal, a pure first order correspondence between the dimension and the linearized output is desired. In this case, the gauged dimension may be precisely represented as a constant multiplied by the linearized output signal, or a constant multiplied by the inverse of the probe output current. In fact, the actual probe output may be represented by a constant in combination with a constant divided by the dimension being gauged, a constant error and a polynomial function of the dimension gauged.

For example, $$i\text{-actual} = i\text{-constant} + \frac{K}{\text{Dimension} + \text{Constant} + \text{Polynomial Dimension}}$$

The polynomial term represents the error or deviation from a straight line correspondence between the first order linearization of the current output of the probe and may in general be viewed as a polynomial of increasing powers of d (the gauged dimension) with unspecified coefficients for each power of d. It is unlikely that very high order powers will have coefficients of any appreciable value affecting the output linearity. Lower order terms in the polynomial may indeed have coefficients which represent a significant error.

For the circuit below, the polynomial is viewed as a function of first and third order errors ($C_1(d+C_2d^3)$) in the gauged dimension. An example is illustrated in FIG. 1 showing a deviation of linearized output from a straight line representation of the gauged dimension. The curve illustrated in FIG. 1 as curve 12 represents a third order error or deviation which, as shown, can reach a significant percentage of full scale gauged dimension.

In accordance with the teaching of the present invention, a system of feedback and preferably feedforward circuitry is provided in a probe output linearization system which introduces a compensating value of higher order character which can, in combination with user adjusted reference inputs, minimize this higher order nonlinearity in the probe output after first order linearization.

A block diagrammatic representation of the circuit for accomplishing this function is illustrated in FIG. 2. As shown there, a probe 14 of the type illustrated in the above-identified commonly assigned U.S. Pat. No.

3,706,919, provides an output current on a line 16 which varies inversely with the dimension gauged by the probe 14. The current on line 16 is applied to a summing circuit 18 to which other inputs, as described below, are provided. The combined output of the summer 18 is applied to a current-to-voltage converter 20 which provides an output voltage corresponding to the magnitude of the input current. This voltage output is applied to a gain determining circuit 22 which provides a preselected gain, a, and a resulting output voltage which corresponds to the input voltage scaled by this factor, a. The signal from the current-to-voltage converter 20 is also fed forward in a preferred embodiment, to a summing circuit to be described later.

The scaled voltage output from the gain determining circuit 22 is applied to a denominator input of a divider 24. The numerator input of the divider 24 is a first reference provided from a calibration source 26. Preferably, the divider 24 squares the reference value at the numerator input and provides a voltage output which is accordingly the ratio of the square of the reference value at the numerator input to the value of the denominator input. The divider inverts the probe output so that it varies directly with dimension. The output of this divider circuit is applied to a summing circuit 28 from which the system output is taken.

Summer 18 receives two additional inputs which are algebraically combined with the signal from the probe 14. In particular, a first input is provided from the calibration control 26 as a second reference having a predetermined constant current, while a second input to the summer is provided from the output of the summer 28. The current thus applied to the current-to-voltage converter 20 represents the mathematical sum of the current supplied from the probe 14, the calibration circuit 26 and the summer 28.

The summer 28 receives, in addition to the output of the divider 24, the signal fed forward from the current-to-voltage converter 20 in the preferred mode of operation, as well as a zero offset reference signal from an offset control 30.

It was noted above that the mathematical expansion of the error polynomial in the equation representing the output of the probe may be assumed to be of cubic form. In this case, the total current error after factoring terms consists of a constant plus a constant times the distance gauged to the first power in combination with a further constant times the inverse of the distance gauged. The first or constant term may be readily adjusted by the addition of a constant value such as that provided by the calibration control 26 to the summer 18. This effectively adjusts the position of figure 12 in FIG. 1 to remove constant effects. The term varying with distance is reduced through the feedback loop from the output summer 28 to the summer 18 which in effect introduces a term varying with probe distance. Suitable scaling of this may be provided by a control 32 which is typically a resistance preset for a particular probe characteristic. Finally, the inverse dimension error term may be compensated by the feedforward circuitry through a control 34. This introduces in the output a term corresponding to the current, or inverse dimension varying variable, and is achieved by the feedforward from the output of the current-to-voltage inverter 20 to the summer 28. The zero network 30 is provided for a final offset compensation in the output from the summer 28 representing actual gauged dimension linearized for first and higher order effects.

In accordance with such a nonlinearity elimination system, the higher order nonlinearities represented in curve 12 of FIG. 1 may be eliminated, leaving a resulting error curve such as the curve 40 illustrated in FIG. 1 with greatly reduced nonlinearities.

A more detailed circuit representation of a higher order nonlinearity correction circuit in accordance with the present invention is illustrated in FIG. 3. As shown there, a probe 50, again of the type illustrated in our above-referenced U.S. patent, provides a current output to the inverting input of an amplifier 52 having a feedback, gain determining resistor 54 from the output to the inverting input. The noninverting input of the amplifier 52 is grounded. Amplifier 52 functions as a current-to-voltage converter. The inverting input provides the function of the summer illustrated as element 18 in FIG. 2 and for this purpose receives the probe current as well as feedback signal through a variable resistor 58, as will be described below. In addition, the current applied to the inverting input may be adjusted through a potentiometer 60 set between positive and negative voltage terminals 70 and 72. The wiper arm of the potentiometer 60 is applied through a resistor 74 to the inverting input of amplifier 52.

The output of the amplifier 52 is applied to the noninverting input of a further variable gain amplifier 76. The output of amplifier 76 is fed back through a gain determining resistor 78 to the inverting input and is applied to ground through a potentiometer 80, the wiper arm of which is applied to the inverting input through a resistor 81. In this manner, the amplifier 76 acts as a current-to-voltage converter, the potentiometer 80 serving the function of gain control.

The output of the gain amplifier 76 is applied to a denominator input of an analog divider circuit 82, such as a log multiplier-divider known in the art. Numerator inputs are applied in common through a resistor 84 from a variable reference source 86. The dual inputs provide multiplication of the reference source value before division by the divider 82 in order to provide the ratio at the output of the divider proportional to the square of the numerator inputs divided by the denominator input. The output of the divider, representing the first order linearized probe signal, provides the feedback signal applied through the resistor 58 to the input of the amplifier 52. The output of the divider 82 is also applied through a variable resistor 88 to the numerator inputs for purposes of further feedback in the nature of feedback through resistor 58. Resistor 88 is optional, or may be used in place of resistor 58. The output of the divider 82 is applied to ground through a potentiometer 90 with the wiper arm thereof applied through a resistor 91 to an inverting amplifier 92 at the inverting input. Potentiometer 90 adds flexibility to system gain variation and is optional. A gain determining resistor 94 is connected between the output of the amplifier 92 and the inverting input. The inverting input also receives a signal fed forward through a variable resistor 96 from the output of an amplifier 98. The inverting input of amplifier 98 is applied through a resistor 100 from the output of the amplifier 76. A resistor 102 is applied between the output of amplifier 98 and the inverting input for gain selection in combination with resistor 100, while the noninverting input of the amplifier 98 is connected to ground. The feedforward loop through the resistor 96 provides the similar function to the feedforward loop through the control 34 illustrated in FIG. 2. A potentiometer 104 connected between a positive reference terminal 106 and ground provides an offset signal through the wiper arm and a resistor 108 for application to the inverting input of the amplifier 92.

Finally, an inverting amplifier 110 is provided to invert the output of the amplifier 92 through a resistor 112 with gain determined by a feedback resistor 114 between the output of amplifier 110 and the inverting input. The noninverting input of the amplifier 110 is grounded. The system output, a signal directly varying with dimension gauged by the probe 50 and compensated for higher order nonlinearities is provided at the output of the amplifier 92 or 110 depending on the polarity desired.

Adjustment of the resistors 58, 88 and 96 along with potentiometer 80 and/or 90 is made empirically with each probe until the error shown by curve 40 is minimized.

The above circuit descriptions are intended as exemplary only, modifications and improvements being considered within the spirit of the present invention as is limited only in accordance with the following claims.

What is claimed is:

1. A system for providing higher order nonlinearity correction in the linearized output of a dimension gauge comprising:
    a probe sensitive to a physical dimension and providing an output signal varying inversely with said physical dimension;
    means responsive to said probe output for providing a linearized signal varying directly in magnitude with said physical dimension and having higher order nonlinearities in signal magnitude; and
    means for reducing said higher order nonlinearities in signal magnitude in said linearized signal.

2. The system of claim 1 wherein said means for reducing higher order nonlinearities includes means for reducing at least first order nonlinearities.

3. The system of claim 1 wherein said means for reducing higher order nonlinearities in said linearized signal includes means for reducing third order nonlinearities in said linearized signal.

4. The system of claim 1 wherein said means for reducing higher order nonlinearities in said linearized signal includes feedback means for combining a portion of said linearized signal with said probe output signal.

5. The system of claim 4 wherein said means for reducing higher order nonlinearities in said linearized signal further includes feedforward means for combining a signal representative of said probe output signal with said linearized signal.

6. The system of claim 1 wherein said means for linearizing said probe output signal includes a divider having numerator and denominator inputs with a signal representative of said probe output applied to the denominator input thereof and a reference signal applied to the numerator input thereof;
    means being provided for generating said reference signal.

7. The system of claim 6 wherein said means for providing said reference signal includes means under operator control for adjusting the magnitude of said reference signal.

8. A system for reducing higher order nonlinearities in a linearized output of a dimension gauging probe comprising:
    a dimension gauging probe having a probe output signal representative of a physical dimension and varying inversely therewith;
    signal combining means having a first input responsive to said probe output and providing an output signal representative of said probe output signal in combination with signals applied to other inputs thereof;
    ratio means having a numerator and a denominator input and providing an output representative of the ratio of the inputs applied to said numerator and to said denominator inputs and receiving on the numerator input an output representative of the output of said combining means and on the numerator input a reference signal;
    means for generating said reference signal;
    means for applying a signal representative of the output of said ratio means as a second input of said combining means.

9. The system of claim 8 further including:
    means for combining the output of said ratio means with a signal representative of the output of the first mentioned combining means to provide a system output, said system output being the output applied to said first combining means as the ratio means output.

10. The system of claim 8 further including means for varying said reference signal in response to an operator control.

11. The system of claim 8 further including means for applying a user variable reference signal to a third input of said first combining means.

12. The system of claim 9 wherein said second combining means includes a third input; and
    means are provided for applying a further reference signal to the third input of said second combining means.

13. The system of claim 8 wherein said ratio means includes means for raising the value of the numerator input thereto to a power.

14. The system of claim 13 wherein the power to which the numerator of said ratio means is raised is the power 2.

15. A system for providing higher order nonlinearity correction in a linearized signal representative of a value comprising:
    means for providing an output signal varying inversely with respect to said value;
    means responsive to said output signal for providing a linearized signal varying in magnitude directly with said value and having higher order nonlinearities in signal magnitude; and
    means for reducing said higher order nonlinearities in signal magnitude in said linearized signal.

16. The system of claim 15 wherein said means for reducing higher order nonlinearities includes means for reducing at least first order nonlinearities.

17. The system of claim 16 wherein said means for reducing higher order nonlinearities in said linearized signal includes means for reducing third order nonlinearities in said linearized signal.

18. The system of claim 1 wherein said means for reducing high order nonlinearities in said linearized signal further includes feedforward means for combining a signal representative of said probe output signal with said linearized signal.

* * * * *